United States Patent [19]

Kenney

[11] 4,167,036
[45] Sep. 4, 1979

[54] DC VOLTAGE CONVERTER AND SHOCK-TYPE HIGH VOLTAGE UTILIZATION DEVICES

[75] Inventor: Frank M. Kenney, Littleton, Colo.
[73] Assignee: U and I, Ltd., Gering, Nebr.
[21] Appl. No.: 823,281
[22] Filed: Aug. 10, 1977

Related U.S. Application Data

[63] Continuation-in-part of Ser. No. 648,624, Jan. 13, 1976, Pat. No. 4,084,218.

[51] Int. Cl.² .................... H02M 7/00; H02M 3/335
[52] U.S. Cl. .................................. 363/61; 231/2 L; 273/84 ES; 361/232; 363/18
[58] Field of Search ................ 231/2 E; 273/84 S; 361/232; 363/16, 18, 20, 59, 60, 61

[56] References Cited
U.S. PATENT DOCUMENTS

| | | | |
|---|---|---|---|
| 3,998,459 | 12/1976 | Henderson et al. | 361/232 X |
| 4,028,596 | 6/1977 | Weber | 363/60 X |

Primary Examiner—William M. Shoop
Attorney, Agent, or Firm—Ancel W. Lewis, Jr.

[57] ABSTRACT

A DC voltage converter includes an oscillator that converts a DC battery voltage to an oscillating voltage, a low voltage transformer that increases the oscillating voltage to a higher oscillating voltage, and a voltage rectifying-capacitor charging network or multiplier that increases the higher oscillating voltage to yet a higher DC voltage at an output terminal for DC high voltage utilization devices and the like. An electric control switch is selectively actuated by the user to apply the battery voltage to the oscillator, resulting in the generation of the stepped-up DC voltage at an output terminal. Another DC voltage converter has an electronic switching circuit that automatically turns the oscillator on and off and a load capacitor across the electrodes that is charged and discharged to provide a shocking voltage. Utilization devices for the voltage developed by the converter shown are a miniature animal training device and a cattle prod device. The miniature animal training device has a pair of outwardly projecting electrodes mounted on a side at one end of the housing that is sized and shaped to fit within and conform to the palm of a hand. The cattle prod device has a pair of electrodes fixedly mounted on the end of a housing assembly made up of telescoping tubular housing sections arranged for relative axial movement whereby the pressing of the electrodes against an object to be shocked actuates the electric control switch and causes a shock of the object. The housing assembly is releasably supported by a rigid handle or an extensible handle assembly.

29 Claims, 26 Drawing Figures

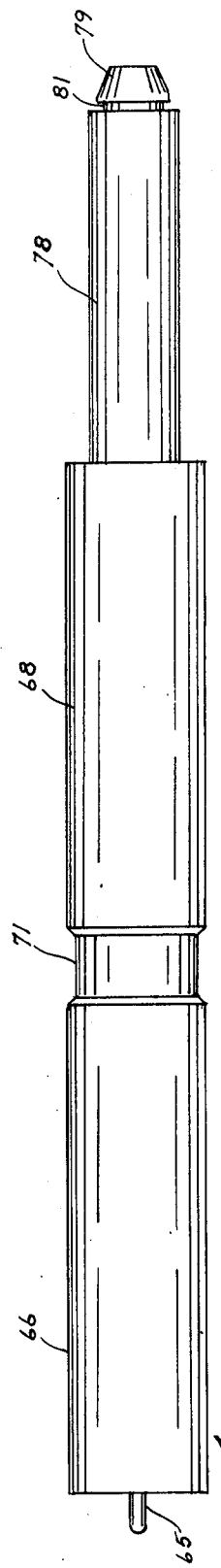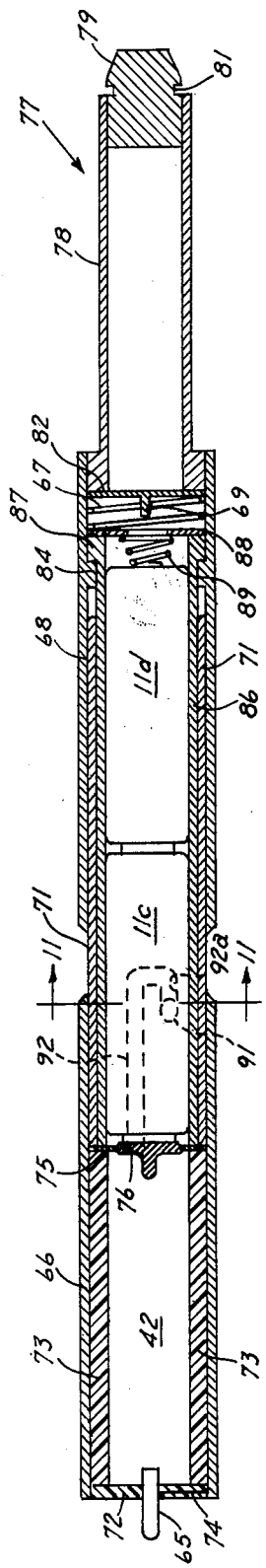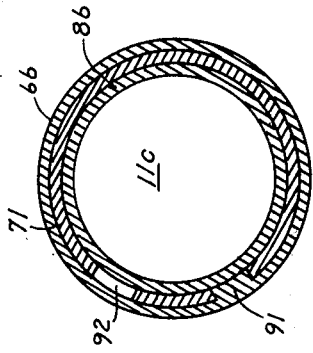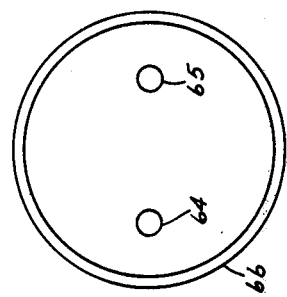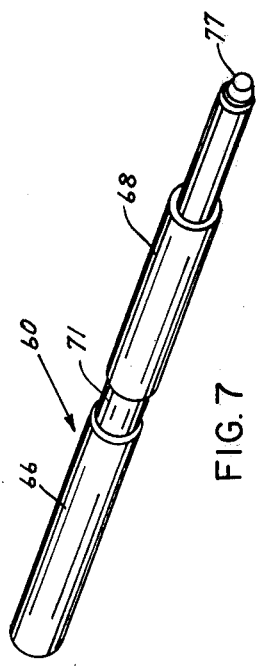

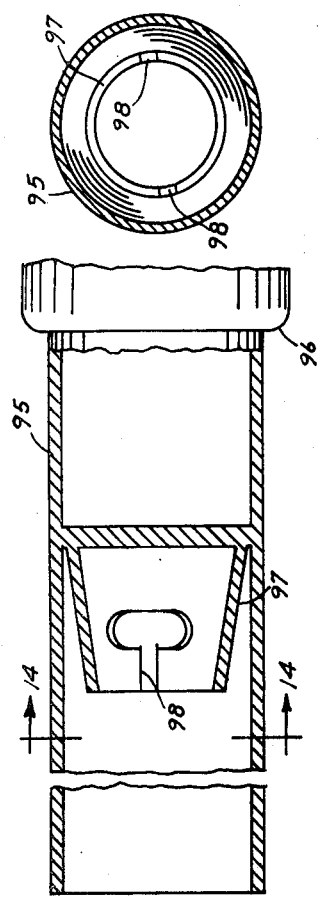
FIG. 14
FIG. 13
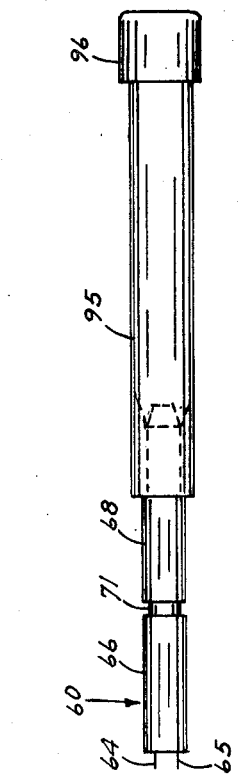
FIG. 12
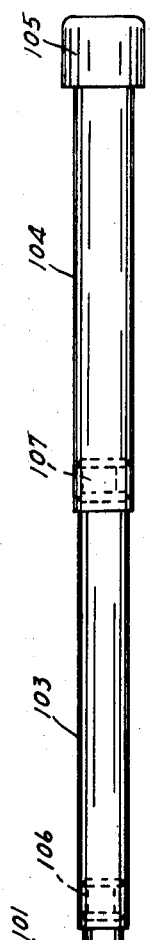
FIG. 15
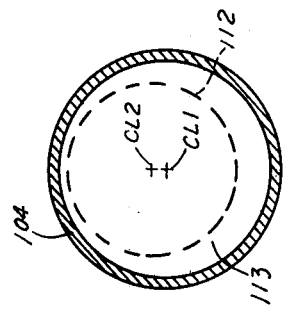
FIG. 17
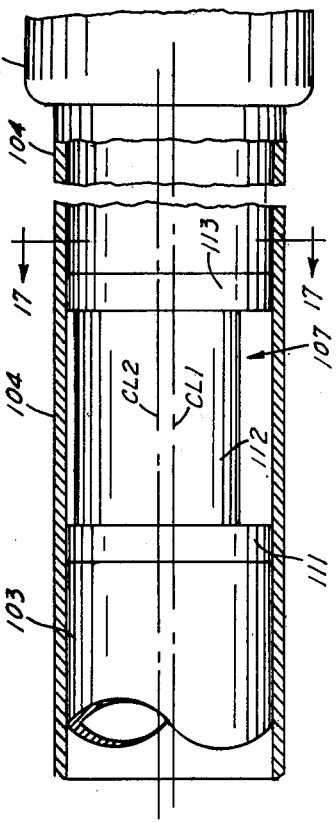
FIG. 16

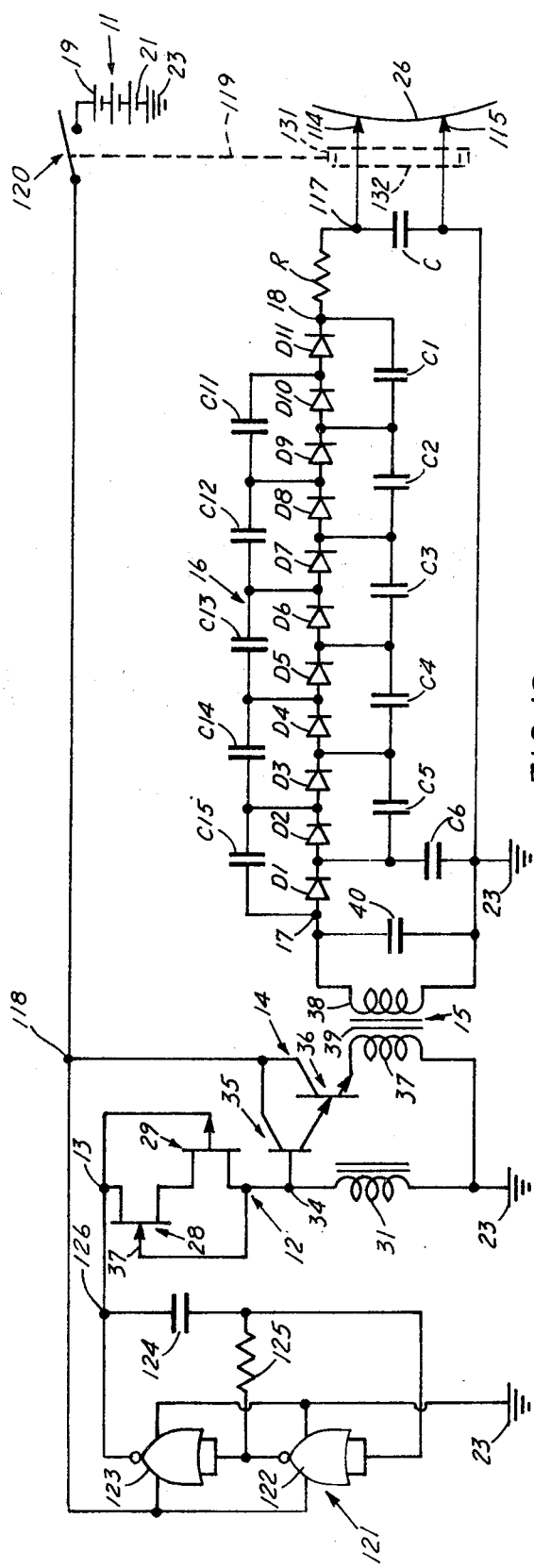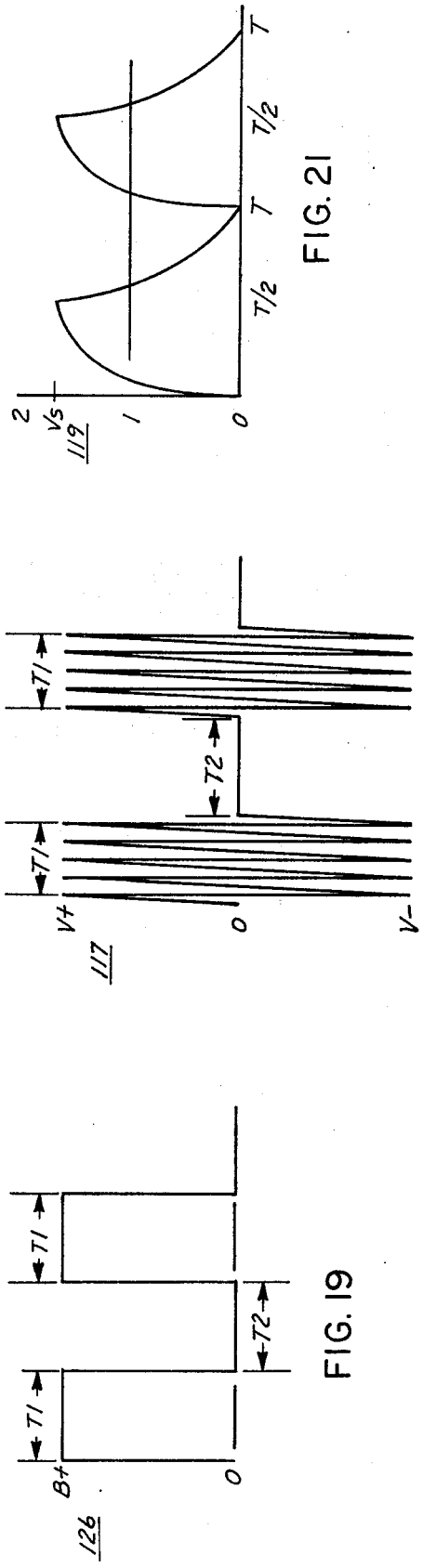

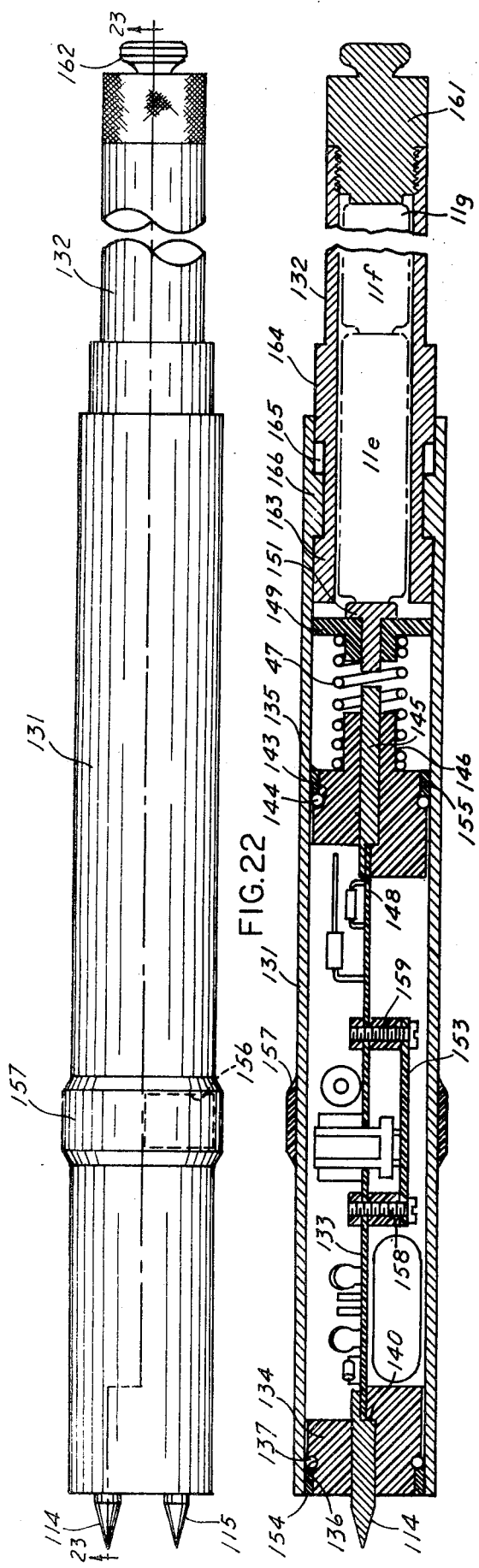
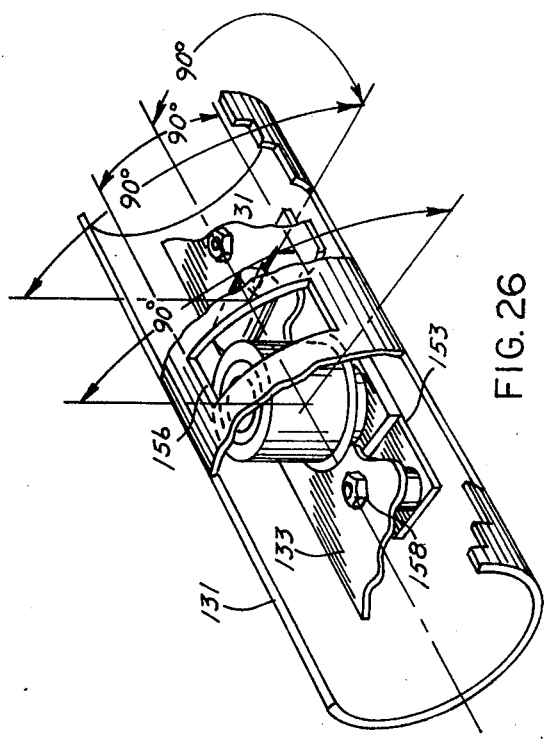
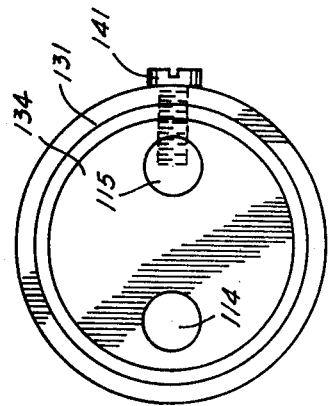
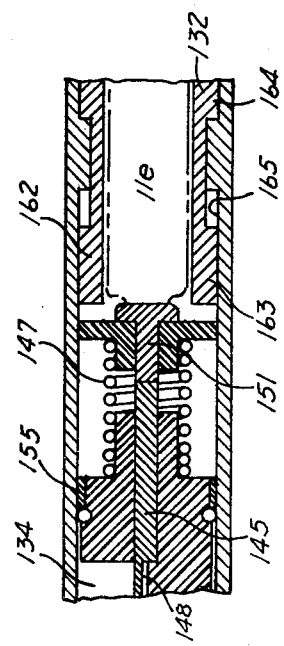
FIG. 22  FIG. 23  FIG. 26  FIG. 25  FIG. 24

DC VOLTAGE CONVERTER AND SHOCK-TYPE HIGH VOLTAGE UTILIZATION DEVICES

This is a continuation-in-part application Ser. No. 648,624, filed Jan. 13, 1976, now U.S. Pat. No. 4,084,218.

FIELD OF THE INVENTION

This invention relates generally to DC converters and voltage utilization devices and more particularly to novel DC converters and voltage utilization shock-type training and prod devices and the like.

BACKGROUND OF THE INVENTION

Various types of DC voltage converters have heretofore been used to convert the voltage of a relatively small sized, relatively low voltage dry cell battery to a considerably higher DC voltage. Prior known DC voltage converters are found in various types of electric shock devices and known shock devices employ a DC converter having a saturated core high voltage transformer which has a primary, a secondary, and feedback windings together with two transistors or like solid state devices that switch on and off. In the operation of this device the transformer becomes saturated to provide amplification of the voltage and/or current. The size of the saturated core transformer is prohibitive for many applications.

Accordingly, it is an object of this invention to provide a novel DC converter that delivers a relatively high DC voltage from a relatively small, relatively low voltage dry cell battery or batteries.

Another object of this invention is to provide a novel electric DC step-up converter that may be constructed as a relatively small, compact unit and will convert relatively low battery voltages to relatively high, substantially DC voltages at relatively small currents for voltage utilization devices such as, for example, a novel miniature animal training device, a novel cattle prod device and the like.

A further object of this invention is to provide a novel miniature animal training device with a DC converter that will fit entirely within the palm of a hand.

Still a further object of this invention is to provide a novel battery powered cattle prod device with a DC converter that is adapted to releasably mount on a rigid or extensible handle assembly.

SUMMARY OF THE INVENTION

In accordance with the present invention there is provided a DC voltage converter that has an oscillator which changes a relatively low DC voltage to an oscillating voltage which in turn is stepped up by a low voltage transformer to a higher oscillating voltage. This higher oscillating voltage is applied to a series of rectifiers that rectify the oscillating voltage and capacitors of decreasing value in a voltage storage and rectifying network or multiplier that is selectively applied by the actuation of an electric control switch to provide a stepped-up substantially DC voltage at an output terminal. Another DC voltage converter has an electronic astable multivibrator that continuously turns the oscillator on and off for selected time intervals and a load capacitor at the output of the voltage multiplier and across the electrodes is charged and discharged to provide a continuous, oscillating, unsymmetrical shocking voltage across the electrodes when the electric control switch is actuated. Voltage utilization devices for said converter shown are in the form of a miniature animal training device that has a housing readily positioned within the palm of a hand that contains a battery or batteries, a converter, an electric switch portion, and has voltage applying electrodes which when pressed against an object provide a shock. A cattle prod device has telescoping tubular housing sections arranged for relative axial movement containing the battery or batteries, converter, electric control switch and has voltage applying electrodes affixed to one end of one of the tubular housing sections.

Other objects, advantages and capabilities of the present invention will become more apparent as the description proceeds taken in conjunction with the accompanying drawings, in which like parts have similar reference numerals and in which:

FIG. 7 is a perspective view of a cattle prod device in accordance with the present invention;

FIG. 8 is a side elevation view of the cattle prod device of FIG. 7 drawn to full scale;

FIG. 9 is a vertical sectional view through the cattle prod device of FIG. 8;

FIG. 10 is a front end elevational view of FIG. 9;

FIG. 11 is a sectional view taken along lines 11—11 of FIG. 10 through the socket but with the battery not sectional;

FIG. 12 is a side elevational view of the cattle prod device of FIGS. 7-11 releasably inserted into the open end portion of a rigid handle;

FIG. 13 is an enlarged fragmentary sectional view of the socket inset from the open end of the rigid handle and its end portion of FIG. 12 that receives the male end of the cattle prod device of FIGS. 7-11;

FIG 14 is a sectional view taken along lines 14—14 of FIG. 13;

FIG. 15 is a side elevational view of the cattle prod device of FIGS. 7-11 releasably inserted into an extensible handle;

FIG. 16 is a sectional view of two telescoping sections of the extensible handle of FIG. 13 illustrating the slidable eccentric lock;

FIG. 17 is a sectional view taken along lines 17—17 of FIG. 16;

FIG. 18 is a schematic electric circuit diagram of another DC voltage step-up converter embodying features of the present invention;

FIG. 19 is a representation of a voltage output waveform for the output of the astable multivibrator switching circuit shown in FIG. 18;

FIG. 20 is a representation of a voltage output waveform for the Darlington configuration circuit shown in FIG. 18;

FIG. 21 is a representation of the voltage output waveform for the voltage multiplier circuit of FIG. 18;

FIG. 22 is a top plan view of another cattle prod embodying features of the present invention;

FIG. 23 is a sectional view taken along lines 23—23 of FIG. 22 with the tubular housing sections in the extended position and the electric control switch in the open position;

FIG. 24 is a sectional view showing the tubular housing sections in the contracted position with the electric control switch in the closed position;

FIG. 25 is an end elevational view of the device of FIGS. 23 and 24 looking toward the forward end; and FIG. 26 is a perspective view of the forward tubular housing section of the device shown in FIGS. 23-25 with external wall portions broken away to show interior parts.

DESCRIPTION OF THE PREFERRED EMBODIMENTS

Figure 1:
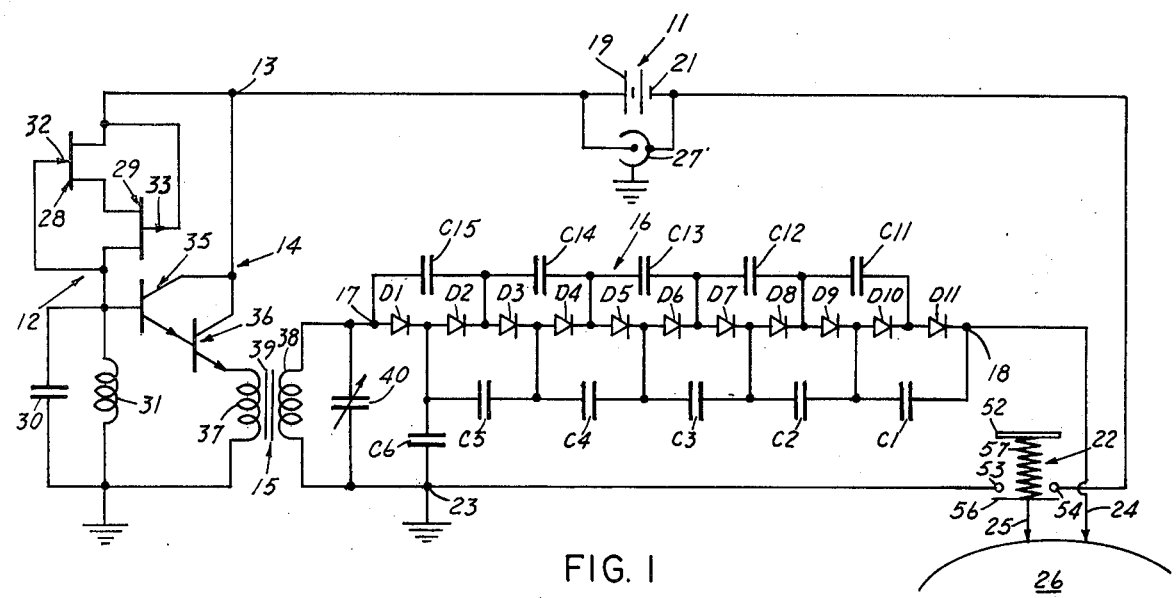
FIG. 1 is a schematic electric circuit diagram of a DC voltage step-up converter and schematic portions of a miniature animal training device constructed in accordance with the present invention.
Figure 3:
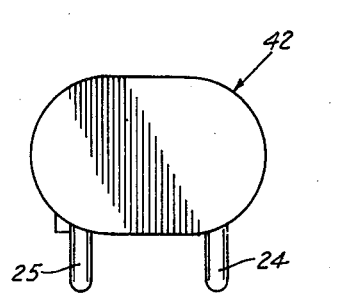
FIG. 3 is an end elevation view of the device of FIG. 2 opposite the end having the battery charging jack, drawn to scale and to two times actual size.
Figure 2:
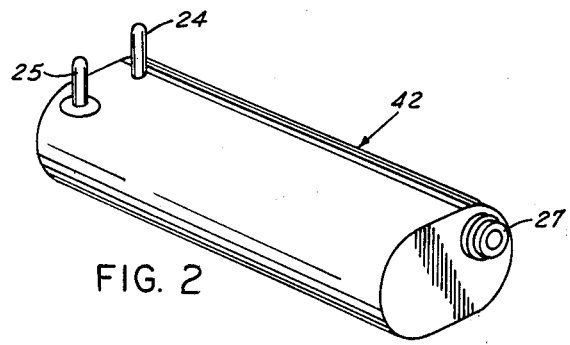
FIG. 2 is a perspective view of a miniature animal training device constructed in accordance with the present invention.
Figure 4:
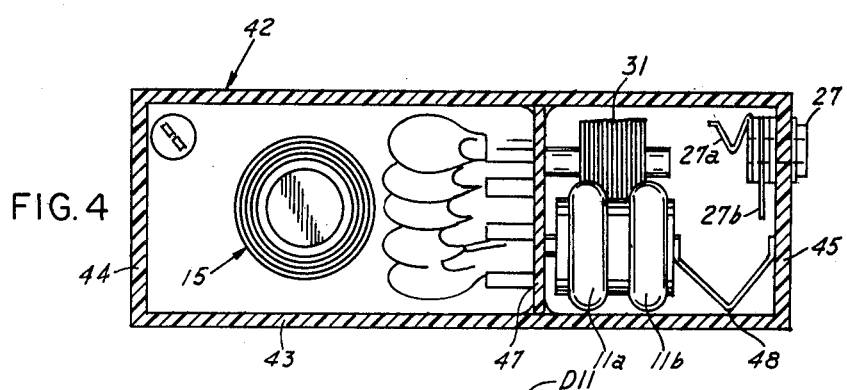
FIG. 4 is a sectional view through the long axis of the device of FIGS. 2 and 3.

Referring now to FIG. 1, there is shown a schematic electric circuit diagram for a DC voltage converter tht steps up the DC voltage of one or more dry cell batteries represented schematically as a battery and designated by numeral 11. The converter shown in FIG. 1 has an oscillator 12 with a power input terminal designated by numeral 13, an impedance interface 14, a low voltage step-up transformer 15, and a voltage rectifying capacitor charging network or multiplier 16 with a power input terminal designated 17 and output terminal designated 18. In the converter shown in FIG. 1 the battery 11 has its cathode 19 connected to the power input terminal 13 and its anode 21 normally ungrounded and connected through an electric control switch 22 to ground designated by numeral 23. In addition there is represented in the circuit diagram of FIG. 1 a pair of electrodes 24 and 25, electrode 24 being connected to the output terminal 18 and electrode 25 being operatively associated with the electric switch portion 22 so that, when the electrodes are pressed against an object represented at 26, the battery anode is connected to ground 23 and this completes the circuit via the electric control switch 22 so that the DC voltage of battery 11 is applied to the oscillator stage 12 and a stepped-up DC voltage generated by the circuit in response to the battery voltage appears at output terminal 18. The electric control switch 22 shown in FIG. 1 is a schematic representation of the type used in the miniature animal training device described in more detail hereinafter with reference to FIGS. 2 through 5. A jack 27 for battery charging is shown schematically in FIG. 1 to facilitate the charging of the dry cell batteries 11 in a conventional manner.

The oscillator 12 comprises a series connected N channel junction field effect transistor 28 and P channel junction field effect transistor 29 which in turn are connected in series with an inductor 31. The transistor 28 has its JFET gate 32 connected to the inductor 31 to be biased at the inductor voltage and the transistor 29 has its JFET gate 33 connected to the input terminal 13 to be biased by the voltage of battery 11. An optional circuit component is capacitor 30 which may be used for tuning the oscillator 12. In general, this oscillator 12 converts the DC voltage of the battery 11 to an oscillating voltage that goes positive and then negative in relation to a zero reference or operates in a Class A mode.

The potential across the inductor 31 is applied across a two-stage transistor network connected in a Darlington configuration which includes an NPN transistor 35 having its base connected between inductor 31 and gate 32, its collector connected to input terminal 13, and its emitter connected to the base of a second NPN transistor 36. Transistor 36 in turn has its collector connected to input terminal 13 and its emitter connected to the primary winding 37 of the transformer 15. In this arrangement the potential produced across the inductor 31 is applied across the emitter-base junctions of the two transistors 35 and 36 which are in series with the primary winding 37 of transformer 15 so that the transistors 35 and 36 are high frequency switching devices for the oscillator and amplify the current flowing to the primary winding 37 and are a high impedance in parallel with inductor 31 to interface between the oscillator 12 and the transformer 15.

This arrangement for transistors 35 and 36 then is an emitter follower Darlington configuration. Transistor 36 is forwardly biased and on or conducting at all times that a DC bias voltage is applied to terminal 13. This Darlington configuration is connected in a circuit including inductor 31 of the oscillator and primary winding 37 of the transformer so as to place a high impedance across the inductor 31 to avoid excessive loading of the oscillator.

The low voltage transformer 15 has a primary winding 37 and a secondary winding 38 wound on a core 39. The voltage applied to the primary winding 37 is an oscillating or alternating voltage and induces a voltage in the secondary winding 38 that is then applied to the network 16. A variable capacitor 40 is connected across the secondary winding 38 to tune the oscillator 12 via the impedance reflected back from the secondary winding to the primary winding of transformer 15.

The input terminal designated 17 for the voltage rectifying-capacitor charging network or multiplier 16 is also the output terminal of the secondary winding 38. This network 16 has a charging capacitor C6 and rectifying diode D1 connected in series with one another between input terminal 17 and ground 23. A plurality or train of successive charging capacitors C5, C4, C3, C2, and C1 are connected in a series circuit including diode D1 between the input terminal 17 and output terminal 18.

Across each of the charging capacitors C5, C4, C3, C2 and C1 there are two series connected diodes designated D2, D3; D4, D5; D6, D7; D8, D9; and D10, D11, respectively, which rectify the oscillating voltage applied to charge the capacitors. Diode D1 is connected to diode D2 so that between input terminal 17 and output terminal 18 there are connected in series eleven diodes designated D1 through D11, respectively.

Across each pair of series connected diodes there is a neutralizing and charging capacitor and specifically across diodes D1 and D2 capacitor C15 and across diodes D2 and D3 capacitor C5. There is further connected across diodes D3 and D4 capacitor C14, across diodes D4 and D5 capacitor C4, across diodes D5 and D6 capacitor C13, across diodes D6 and D7 capacitor C3, across diodes D7 and D8 capacitor C12, across diodes D8 and D9 capacitor C2, across diodes D9 and D10 capacitor C11, and across diodes D10 and D11 capacitor C1 with diode D11 and capacitor C1 being connected to the output terminal 18 with object 26 becoming the load resistance for the circuit. Capacitors C11, C12, C13, C14, and C15 are in series with one another. There is a neutralizing and charging capacitor of a corresponding size or capacitance with one of the series of successive charging capacitors. Specifically, the capacitance of C5 and C15 is equal; the capacitance of C4 and C14 is equal; the capacitance of C3 and C13 is equal; the capacitance of C2 and C12 is equal, and the capacitance of C1 and C11 is equal. Beginning with capacitor C6 at the input terminal the capacitance of each is less so that the charging times for each successive capacitor is less from the input terminal 17 to the output terminal 18.

Upon the application of the oscillating or alternating voltage produced at the transformer secondary 38 there is a positive and negative going voltage in relation to a zero reference. When a positive potential is first applied to terminal 17 one plate of capacitor C15 starts to become positively charged. At a certain positive voltage level (0.6 v DC) diode D1 conducts and one plate of each of capacitors C5 and C6 that are connected together becomes positively charged. At a certain higher positive voltage (1.2 v) diode D2 conducts and a positive potential is now applied to the opposite plate of capacitor C15 which in effect becomes neutralized or has a neutral charge while the common plates of capacitors C5 and C6 continue to become positively charged. As the capacitors C5 through C1 charge positive, then each of the diodes D3 through D11 conducts providing a neutral charge on capacitors C14, D13, C12, and the charges on capacitors C1, C2, C3, C4, C5, and C6 are cumulative to produce a total voltage increase between input terminal 17 and output terminal 18.

In the operation of the voltage multiplier circuit 16, then, when diode D1 is forwardly biased the current flowing through capacitor C6 to ground very nearly equals the current flowing through capacitor C5 because the forward biased diode resistance approaches zero, and when the input voltage at terminal 17 reverses in polarity the current through diode D1 is reversal biased and the current flows across D2 and the direction of the current in and out of capacitors C6 and C5 is reversed but the magnitude of the voltage gain across the capacitor is the same. Mathematically it can be shown that the voltage gain between input terminal 17 and across capacitor C6 is the ratio of the capacitance of C6 and C5 or C6/C5 and the voltage gain across capacitor C4 is C6/C4 so that the voltage increase or voltage gain between terminal 17 and terminal 18 is approximately the sum of: (C6/C5)+(C6/C4)+(C6/C3)+(C6/C2)+(C6/C1).

A miniature animal training device illustrated in more detail in FIGS. 2–5 has a rigid shell or housing 42, preferably made of a molded plastic material shown as including an elongated thin-walled hollow body portion 43 with opposed end wall portions 44 and 45 closing the ends thereof. The transverse cross section of the housing has opposed rounded or radiused side wall portions and opposed flat side wall portions to take the appearance of a flattened cylinder. The pair of electrodes designated 24 and 25 project laterally out from a flattened side wall adjacent one end.

Within the housing 42 there is mounted a circuit board 47 on which a majority of the electric circuit components shown schematically in FIG. 1 are mounted. The transformer 15 is shown mounted inside the housing adjacent the electrodes. Also shown as included in the housing are two dry cell batteries designated 11a and 11b and a bias spring 48 holds the batteries in place. The jack 27 for the battery charger is mounted in the end wall 45 and includes a conductive member 27a that engages the positive male part of a male plug (not shown) and a conductive member 27b insulated from member 27a that engages the negative part of the plug. A conventional battery charger plug (not shown) inserts into this jack 27 to charge the batteries as required.

The electric control switch 22 is shown mounted in the housing with the electrode 25 projecting outwardly therefrom and includes a tubular housing 51 and an end cap 52 of a non-conductive material closing the end of the housing opposite the electrode which carries a pair of pin-like terminals 53 and 54. The movable electrode 25 has an enlarged end portion 56 made integral with the electrode 25 that is slidable inside housing 51 and arranged so that the electrode 25 extends through an opening in an end wall opposite wall 54. A spring 57 contained in the housing 51 between cap 54 and the opposite end wall urges the movable electrode 25 to the outer position and, when pressure is applied to the electrode 25, it moves to an inner position in which the enlarged end portion 56 makes an electric connection between the two terminals 53 and 54 to complete the circuit. Upon release of the pressure against the electrode the spring 57 urges the electrode 25 to the outer position which opens the circuit by ungrounding the battery.

Figures 5, 6:
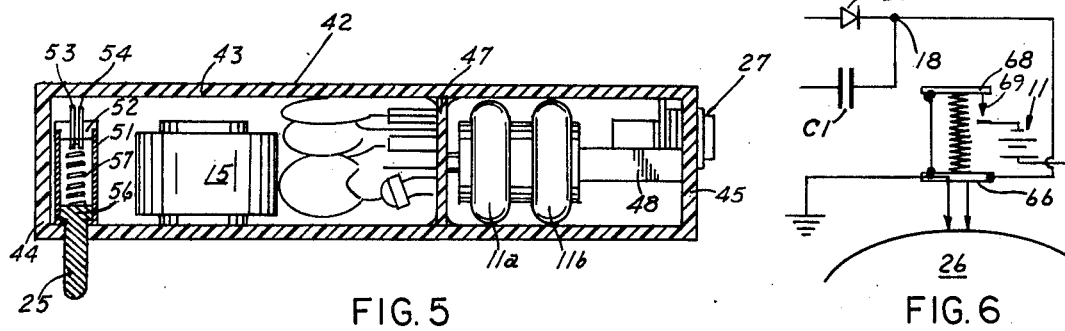
FIG. 5 is a sectional view through the short axis of the device of FIGS. 2 and 3 with the housing broken away to show interior construction and a vertical section through the movable electrode and electric control switch.
FIG. 6 is a portion of an electric circuit diagram showing a modification of FIG. 1 for the cattle prod device described in the subsequent Figures.

A modification of the circuit diagram of FIG. 1 is shown in FIG. 6 for the cattle prod device designated 60 described hereinafter. This circuit shown has a pair of electrodes designated 64 and 65 which engage object 26. Electrodes 64 and 65 are affixed at the forward end of a conductive forward housing section 66. A spring 67 is held between the forward housing section 66 and a rear housing section 68. When the electrodes are pressed against an object, the electric circuit between the oscillator and battery 11 is completed by grounding one side of the battery 11. The electrical connection is completed between a contact 69 associated with the rear housing section 68 that is urged against the anode of the battery. The rear housing section 68 is shown as electrically connected with the forward housing section 66.

Referring now to FIGS. 8–12, the cattle prod housing assembly shown has the forward outer housing section 66, rear outer housing section 68 and an intermediate housing section 71 telescopically received within the front and rear outer housing sections together with an inner housing section telescoped within the intermediate housing section 71. The forward outer housing section 66 is made of a conductive metal and has a non-conductive front end wall 72 through which the electrodes 64 and 65 project and are affixed. The housing 42 of the animal training device above described with electric circuitry for the converter is mounted in the forward portion of the forward outer housing section 66 and is held firmly by a layer of epoxy 73. In this form, however, the pair of electrodes 65 and 64 are affixed to and project out from the end of the housing 42 as distinguished from the sides in the earlier form. A lead line 74 connects from electrode 65 to the forward outer housing section via 72. A rear end wall 75 of a non-conductive material supports a contact 76 for the dry cell batteries designated 11c and 11d.

The rear outer housing section 68 has a male joint portion 77 comprised of a tube 78 of reduced diameter with a beveled edge 79 and a groove 81 inset from the end and beveled edge at the end adapted for insertion into a female socket in a handle described hereinafter. Moreover, the rear outer housing section 68 carries a transverse disc 82 with a pin-like contact 69 on the inside as well as having an inner annular retaining flange 84.

Within the intermediate housing section 71 there is telescoped the inner housing section 86 containing dry cell batteries 11c and 11d and having an external flange 87 at the rear end that is rearward of flange 84 so as to be held against pulling out of the rear outer housing section 66 by butting against the internal flange 84. The inner housing has an end cap 88 with an aperture and a bias spring 89 between the rear battery 11d and the end cap 88.

As best seen in FIG. 11, the forward outer housing section 66 has an inside projection 91 which inserts into a slot 92 in the intermediate housing section 71 and opens into the forward end thereof. This slot 92 extends rearwardly and turns back in an end portion 92a that retains the intermediate housing section 71 inside the forward outer housing section.

In assembling the housing assembly the intermediate housing section 71 is inserted into the forward outer housing section 66 and the projection 91 is positioned in slot 92 and moved to the rear position, the forward outer housing section twisted and the projection 91 then is urged by spring 89 into the slot portion 92a. Upon the pressing of the electrodes 64 and 65 against an object, the forward outer housing section 66 and intermediate housing section 71, which are electrically connected by a forced fit relationship, are moved relative to the rear outer housing section 68 causing contact 69 to engage the anode of the rear battery 11d whereby to complete the circuit, and upon removal of the pressure the forward outer housing section 66 and intermediate housing section 71 move forwardly from the rear housing section 68 and the circuit is broken by the action of the bias spring 67.

Since the cattle prod device of FIGS. 8-11 is usually used on cattle, it may be convenient for extra reach to attach the device into a handle 95 illustrated in more detail in FIGS. 12-14. To this end the handle 95 has a hollow tubular portion with a grip 96 at one end and open at the other end that is sized so that the male portion 77 of the cattle prod device 60 will insert thereinto. As best seen in FIG. 13, the female part of the socket is inset from its open end and includes an annular tapered female socket portion 97 affixed to the inside of the tube with an inner tubular section adapted to receive the male end portion in a force-fitted joint. The female socket portion 97 has a slot 98 along each side to allow for flexibility of the opposed finger portions.

For yet a greater reach to apply the electrodes to a steer, cow or the like over a greater distance, there is shown in FIGS. 15-17 an extensible handle assembly 101 which is comprised of a front tubular section 102 having an open front end with an internal female socket into which the cattle prod device 60 is inserted and held in the female socket inset in from the open end as with the previous rigid handle 95, an intermediate tubular section 103, and a tubular handle section 104 with a grip 105.

As best seen in FIGS. 16 and 17, a locking cam 106 is mounted on the rear end of front tubular section 102 and is telescoped within section 103 and a locking cam 107 is mounted on the rear end of tubular section 103 and telescoped within section 104. The front tubular section 102 then is telescopically received in the intermediate tubular section 103 and in turn the intermediate tubular section 103 is telescopically received in the handle section 104. The rear ends of the front tubular section with its locking cam 106 and the intermediate tubular section with its locking cam 107 allows the telescoping sections to be locked together against relative longitudinal movement for a given position for the locking cam.

Referring now to locking cam 107, this is shown as comprised of a hub 111 of a diameter that will slide inside section 104 having a center CL1, an offset or eccentric shaft on a center CL2 and an end hub on center CL1. As the hub 111 is rotated about its axis CL1 the offset shaft 112 moves the outer hub 111 to a frictional engagement with the inside of the wall of the tubular handle section 104 and the sections 103 and 104 are held against relative longitudinal movement. When rotated furthere there is a position wherein the tubular intermediate section 103 slides freely relative to the outer handle section 104. The operation of locking cam 106 in relation to tubular sections 102 and 103 is the same.

By way of illustration only and not by way of limitation, there are listed below components that have been found suitable for use in the devices illustrated in FIGS. 1-17:

| Component | Value | Type and Model No. |
|---|---|---|
| 11a, 11b | 1.25 volt, each | Nickel Cadmium, Eveready V20 |
| 28 | Small Signal RF | A5T3821 Texas Instruments |
| 29 | Small Signal RF | HEPF1035 Motorola |
| 35 | Medium Power | 2N3904 |
| 36 | Medium Power | 2N3904 |
| D1 to D11, inclusive | 2.5 amp 1.KV | R170 International Rectifier |
| 31 | 2.5mH | 70F253AI J. W. Miller |
| 15 | 1:100 | |
| C6 | 300pf | Ceramic disc |
| C5, C15 | 250pf | Ceramic disc |
| C4, C14 | 200pf | Ceramic disc |
| C3, C13 | 150pf | Ceramic disc |
| C2, C12 | 100pf | Ceramic disc |
| C1, C11 | 50pf | Ceramic disc |
| 40 | 2-70pf | |
| 11c, 11d | 1.5 volt each | AA cells |
| 12 | 250 KHz | |

The approximate size of the housing 42 for the animal training device is:
Width: 13/16 inch
Height: 9/16 inch
Length: 2¼ inch The approximate voltage gain for network 16 for the circuit with the above listed values is about 14.7; the approximate voltage output of the animal training device is about 600 v. DC; the approximate output of the cattle prod device is about 1450 v. DC.

Referring now to FIG. 18, the schematic electric circuit diagram shown has dry cell batteries generally designated by numeral 11, an oscillator 12, impedance interface 14, transformer 15 and voltage multiplier 16, as previously described with reference to FIG. 1, with like parts bearing like reference numerals, and the previous description of FIG. 1 also applies to FIG. 18. This converter may be used in the devices shown in FIGS.

2-17 but is herein specifically described with reference to a voltage utilization device in the form of a cattle prod herein illustrated in FIGS. 22-26.

The battery 11 has a cathode 19 connected to an electric control switch 120 and its anode 21 connected to ground 23, the DC voltage of the battery being coupled to an electronic switching circuit 121 that functions to continuously switch the DC voltage from the battery to the input terminal 13 of the oscillator on and off in a continuous selected duty cycle, as described more fully hereinafter.

In the circuit shown in FIG. 18 there is represented a pair of electrodes 114 and 115, with electrode 114 being the high voltage electrode because it is connected to the output terminal 18 of the voltage multiplier 16 through a resistor R and electrode 115 being the ground electrode since it is connected to ground designated by numeral 23. An output terminal on the high voltage electrode 114 is designated by numeral 117. The electrodes 114 and 115 are shown schematically in FIG. 18 as carried on the front tubular housing section 131 and mechanically coupled to the control switch 120, as represented by dashed line 119, whereby movement of the electrodes on the front housing section 131 to the retracted position, as by pressing the electrodes against a body designated by numeral 26, causes an actuation and closure of control switch 120. The rear housing section 132 is shown schematically in FIG. 18.

The electronic switching circuit 121 shown in FIG. 18 is an astable multivibrator and more specifically is a complimentary metal oxide semiconductor C-MOS integrated circuit chip having a first NOR gate 122 and a second NOR gate 123. Each of the NOR gates has two inputs connected together and an output with the output of NOR gate 122 connected to the inputs of NOR gate 123. Each of the NOR gates illustrated preferably are complimentary MOSFET'S which have a source electrode connected to DC terminal 117 so that the DC battery voltage is applied thereto when control switch 120 is closed. The NOR gates further have drain electrodes that are connected to ground 23. A capacitor 124 and a resistor 125 are connected in a series circuit between the output of NOR gate 123 and the output of NOR gate 122.

The output of NOR gate 123 is the output of the electronic switching circuit 121 at a terminal designated by numeral 126. In general, the switching circuit 121 has an ON mode and an OFF mode represented by the continuous waveform shown in FIG. 19. During the ON mode the NOR gates 122 and 123 are operating such that a substantially DC voltage having an amplitude designated B+ appears at terminal 126 for a time interval designated T1 and during the OFF mode substantially a zero DC voltage appears at terminal 126 for a time interval designated T2. The square wave voltage waveform at terminal 126 is a continuous, repetitive train to in effect repeatedly turn the oscillator on and off for selected time intervals. The preferred time cycle is 50% on and 50% off.

In the operation of the switching circuit 121, when the output of NOR gate 123 is high the capacitor 124 becomes charged. As a result the input to NOR gate 122 is high and its output is low. Resistor 125 is returned to the output of NOR gate 122 to provide a path to ground for the discharge of the capacitor 124. As long as the output of NOR gate 122 is low the output of NOR gate 123 is high. As the capacitor 124 discharges, however, the voltage generated approaches and passes through the transfer voltage point of NOR gate 122. At the instant this cross-over occurs the output of gate 122 becomes high and as a result the output of gate 123 becomes low and the capacitor 124 is charged negative.

The resistor 125 provides a charge path to the supply voltage at terminal 13. The capacitor begins to charge at this voltage and again the voltage approaches and passes through the transfer voltage points of NOR gate 122. At that instant the circuit again changes state and the cycle repeats.

A suitable chip for this purpose is a Motorola Model MC14001CP with two of the NOR gates connected as shown and the other two NOR gates having the inputs at ground and the outputs open or not connected.

As is depicted in FIG. 20, by virtue of the operation of switching circuit 121 the oscillator circuit 12 is turned on during time interval T1 and off during time interval T2 to produce bursts of the oscillating voltage of amplitude V+ that go positive and then negative V− in relation to a zero reference. These bursts of oscillating voltage as depicted in FIG. 20 appear at the output of the oscillator which is at the base electrode of transistor 35 at a terminal designated by numeral 34.

The voltage rectifying-capacitor network or multiplier circuit designated by numeral 16 increases the voltage applied to its input terminal 17 multifold and for the circuit arrangement shown is approximately eleven times. An amplified version of the timed bursts of oscillating voltages depicted in FIG. 20 is used to charge and discharge the load capacitor C. The capacitor C is charged by the bursts of oscillating voltage through resistor R. The voltage waveform across the load capacitor C is represented in FIG. 21 and is essentially a sawtooth waveform which results from an exponential charging during a time interval designated T/2 and a discharging for a time interval from T/2 to T which of course repeats in a continuous train or continuous cycle of operation. The equation for this waveform is $$V_c = V_s (1 - e^{-\frac{T}{RC}})$$

where $V_c$ is the voltage across the capacitor and $V_s$ is substantially the DC supply voltage provided at terminal 18 at the output of the voltage multiplier circuit 16.

Resistor R has a resistance that is the reciprocal of the transconductance of voltage multiplier 16. The capacitor C is in shunt with the applied load 26 across electrodes 114 and 115 and the series connected capacitors of the voltage multiplier 16 which the ungrounded output terminal 18 sees looking back at the voltage multiplier 16. The resulting output shocking voltage represented in FIG. 21 is oscillating or alternating in that it goes both positive and negative in relation to a mean axis represented by a horizontal line located approximately midway between the amplitude peaks and is unsymmetric above and below this horizontal line.

The electric shock device shown in FIGS. 22-26 is in the form of a cattle prod and comprises a generally tubular housing made up of a forward tubular housing section 131 and a rear tubular housing section 132 with end portions thereof slidably telescoping together for relative axial movement between an extended position (FIG. 23) and a retracted position (FIG. 24). In the extended position the shocking voltage is removed from the electrodes and in the retracted position the shocking voltage is applied.

The forward housing section 131 includes a hollow metal tube or tubular body of a selected length made of electrically conductive material such as aluminum and contains or houses the electric converter circuit such as the one shown in FIG. 18. The electric converter circuit is mounted on a primary printed circuit board 133 supported by a front end cap 134 and a rear end cap 135 that slidably inserts into the forward open end of the housing section 131.

The front end cap 134 is a generally cylindrically shaped body sized to insert into the front tubular section and is made substantially solid and of an electric insulation material such as molded plastic. An annular groove 136 in the periphery of the front end cap supports a resilient O-ring 137 which serves to seal off the inside of the front section to keep out moisture and the like.

The electrodes 114 and 115 are mounted in the front end cap in spaced relation to one another and along a diameter line on each side thereof, as best seen in FIG. 25. High voltage electrode 114 is made of a rod-like electrically conductive material. Electrode 114 has a tapered forward end portion and the rear end portion is undercut or stepped at 140 to provide a slot into which the forward end of the circuit board 133 inserts in a friction-fit relationship to make electrical contact with electrode 114. Electrode 115 is the ground electrode and has the same shape as electrode 114 and also has an undercut or step in the end to form a part of the slot for receiving the forward end of the printed circuit board. A set screw 141 threads through an aperture in the forward tubular section 131 and into the ground electrode 115 to electrically connect the ground electrode to the forward housing section which serves as the electrical ground.

The rear end cap 135 is also a generally cylindrically shaped body sized to insert into the front tubular section and is made substantially solid of an electric insulation material such as molded plastic. An annular groove 143 in the periphery supports a resilient O-ring 144 which serves to seal off the inside of the front section containing the electric circuitry at the rear end of the front housing.

The rod-like contact element 145 of electrically conductive material is mounted in the center of the rear end cap 135 and projects beyond the rear end thereof to provide one electric contact for the electric control switch 120. The rear end cap 135 further has a rear end section 146 of reduced diameter over which a coil spring 147 is telescopically mounted. The contact element 145 is undercut or stepped at the front end at 148 to provide a slot into which the rear end of the printed circuit board 131 is slidably inserted in a friction fit to make an electric contact therewith and complete the electric connection between element 145 and high voltage electrode 114. The electric control switch 120 further has a movable insulator body 149 that carries a movable electrically conductive contact element 151. The body 149 is engaged by spring 147 that normally holds contact elements 151 and 145 out of contact (FIG. 23).

The primary printed circuit board 133 supports a second printed circuit board 153 on which the voltage step-up transformer 15 is mounted. This secondary printed circuit board 153 is shown as fastened to board 133 by screw fasteners 158 and 159. Inductor 31 is mounted on board 133.

In the assembly the circuit assembly of the end caps and printed circuit boards are inserted into the forward housing section 131 as a unit and a rear stop ring 155 affixed inside the forward housing section 131 limits the extent of insertion, and a forward stop ring 154 is press-fitted into place after the circuit assembly is in place to affix it to the forward tubular body. The electrodes 114 and 115 then are rigidly affixed to the forward housing section to move therewith.

The forward housing section 131 has a window or opening 156 disposed relative to the position of the transformer 15 and the inductor 31 to form an eddy current barrier between these two elements due to the higher frequencies of the current involved. As best seen in FIG. 26, this opening spans an arc of 90° of the circumference of the front tubular body. The inductor 31 and the transformer 15 are arranged so that their axes are at 90° to one another. The opening 156 covers about a 90-degree quadrant of the end of the transformer and is covered with a ring-shaped cover 157 made of an electric insulator material, preferably molded Delrin that fits over the housing to prevent the entry of moisture or foreign particles into the electric circuit.

The rear housing section 132 contains the DC battery 11, illustrated as three DC dry cells designated by numerals 11e, 11f, and 11g with an end cap 161 that threads into the rear end to facilitate the removal and replacement of the dry cell batteries. The external surface of end cap 162 is knurled. The rear end cap carries a releasable male joint portion 162 to facilitate its releasable connection with a handle for the shock device.

The rear housing section 132 has a front raised portion or sleeve 163 and a rear raised portion or sleeve 164 on the external surface thereof defining an annular groove 165. The front housing section 131 has a raised portion or sleeve 166 projecting inwardly from the internal surface thereof and disposed in and axially slidable in the groove 165. The front sleeve 163 engages the internal sleeve portion 166 to limit the extent of rear movement to the extended position and prevent the tubular housing sections from separating, while the rear sleeve portion 164 limits the movement to the contracted position for the two housing sections.

When the housing sections are moved to the contracted position the contact members 145 and 151 come together and abut at the ends to couple the anode 21 of the front cell 11e to the circuit board and the cathode 19 of the rear cell 11g to ground to apply the DC voltage of the cells 11e, 11f and 11g to the voltage multiplier and oscillator circuits, which then operate in the manner above described.

By way of illustration only and not by way of limitation, there are listed below components that have been found suitable for use in the device illustrated in FIGS. 18–26:

| Component | Value | Type and Model No. |
| --- | --- | --- |
| 121 | | MC14001CP Motorola CMOS QUAD NOR |
| 125 | 4.7K | Allen-Bradley Style RC ¼W 10% tol. |
| 124 | 820pf | Ceramic Disc Sprague 5GA-T82 |
| 28, 29 | | MEL 4881S Panasonic Lambda Diode |
| 31 | 10mH | J W Miller 70F102A1 RF Choke |

-continued

| Component | Value | Type and Model No. |
|---|---|---|
| 14 | | GE D40C1 Power Darlington |
| 15 | | 4 kv Trigger Coil Radio Shack |
| C | 40nF | 6PS-S40 Difilm Dipped Tubular Cap |
| R | 4.7K | Allen-Bradley Style RC ¼W 10% tol. |
| 11e, 11f, 11g | 1.5 volt each | AA Cells |
| D1 to D11, inclusive | | G.E. DT230H Silicon Rectifiers |

The values of capacitors C1 through C11 are the same as those described with reference to FIG. 1. Using a DC battery voltage of about 4.5 volts the oscillator 12 supplies about 4.5 volts, the oscillator 12 supplies about 4.5 volts AC to the primary winding 37, and the secondary winding has about 170 volts AC. This voltage is increased about eleven times by the voltage multiplier to about 1700 volts DC. The on-off switching of the multivibrator switching circuit 121 then provides bursts of oscillations that have an amplitude of about 1700 volts that is AC, unsymmetric and almost 380 times the battery-supplied DC voltage.

The frequency of the pulse waveform shown in FIG. 19 at the outpost of the multivibrator is about 2 KHz. The frequency of the oscillations of the oscillator 12 is about 300 KHz.

Although the present invention has been described with a certain degree of particularity, it is understood that the present disclosure has been made by way of example and that changes in details of structure may be made without departing from the spirit thereof.

What is claimed is:

1. A miniature animal training device comprising:
   a housing of a size adapted to conform to and fit within the palm of a hand,
   a pair of electrodes projecting outwardly from one side of said housing adjacent one end thereof,
   a battery mounted in said housing providing a DC voltage,
   a DC voltage step-up converter including portions mounted on a circuit board in said housing, said converter including:
      an electric oscillator selectively coupled to said battery for converting the DC voltage of said battery to an oscillating voltage;
      a low voltage transformer coupled to said oscillator for increasing said oscillating voltage;
      a capacitor charging voltage step-up network including a series of charging capacitors that are successively charged by the output voltage of said transformer and having an output terminal for converting said higher oscillating voltage to an increased substantially DC voltage at said output terminal;
      an electric switch portion actuated by the movement of one of said electrodes to couple said battery voltage to said oscillator circuit whereby a substantially DC voltage is produced at said output terminal that is applied as an electric shock at said electrodes; and
   means adapted for selectively charging said battery in said housing.

2. A cattle prod device comprising:
   a housing including a forward outer housing section, a rear outer housing section and an intermediate housing section, said rear outer housing section terminating in a male joint portion;
   a pair of electrodes affixed to and projecting outwardly from said forward outer housing section;
   at least one DC battery mounted in said housing providing DC voltage; and
   an electric voltage converter selectively coupled to said battery including portions mounted on a circuit board in said housing, said converter including:
      an electric oscillator selectively coupled to said battery for converting the DC voltage of said battery to an oscillating voltage;
      a low voltage transformer coupled to said oscillator increasing said oscillating voltage;
      a voltage step-up network including a series of charging capacitors that are successively charged by the voltage at the output of said transformer and having an output terminal converting said higher oscillating voltage to an increased substantially DC voltage at said output terminal; and
      an electric switch portion actuated by the movement of said forward outer housing section relative to said rear outer housing section to selectively couple said battery voltage to said oscillator circuit whereby a substantially DC voltage is produced at said output terminal that is applied to one of said electrodes and applied as a shock by said electrodes,
   said forward outer, intermediate and rear outer housing sections being made of an electrically conductive material, one of said electrodes being at an electrical ground and connected to said housing sections and the other of said electrodes being electrically connected to said output terminal, said forward outer housing section being connected to said intermediate housing section, said intermediate housing section being electrically connected to said rear outer housing section and to a contact movable with said rear outer housing section, said contact electrically engaging said battery when said electrodes are pressed against an object to be shocked.

3. A cattle prod device as set forth in claim 2 including means for releasably coupling said forward outer housing section with said rear outer housing section.

4. A cattle prod device as set forth in claim 2 including an inner housing section within said intermediate housing section adapted to contain said DC battery.

5. A cattle prod device as set forth in claim 2 wherein said forward outer housing section moves relative to said rear outer housing section against the action of a spring which returns the forward outer housing section to a position in which the electric switch portion is open to decouple the battery voltage from the oscillator.

6. An electric shock device comprising:
   a housing including first and second coaxially aligned housing sections having end portions slidably telescoping together for relative axial movement between an extended position and a contracted position;

a pair of electrically conductive electrodes affixed to and projecting outwardly from said first housing section;

a DC battery in said housing providing a DC voltage;

a DC voltage step-up converter in said housing for increasing said DC voltage to an amplitude and form suitable for electric shocking purposes;

a control switch including a first contact element and a second contact element with at least one of said contact elements movable relative to the other contact element by the relative axial movement of said first and second housing sections to electrically couple said DC voltage to said converter; and means to resiliently urge said housing sections to said extended position and said movable contact element to an open, non-contacting position and yieldable to permit said housing sections to be moved under pressure to the contracted position and said movable contact element to a closed, contacting position against said other contact element whereby a shocking voltage is applied across said electrodes, each of said housing sections having first and second substantially rigid, electrically conductive tubular bodies, respectively, said electrodes being mounted on an electric insulator body secured at one end of said first tube, there being an electric connection from one of the electrodes to said first tubular body to connect said one electrode to essentially an electric ground.

7. An electric shock device as set forth in claim 6 wherein one of said housing sections has a pair of axially spaced raised portions defining an annular groove on the external surface thereof and the other of said housing sections has a raised portion projecting inwardly from the internal surface thereof and axially slidable in said groove to establish the limits of said relative axial movement and to hold said housing sections from separation.

8. An electric shock device as set forth in claim 6 wherein said one contact element is carried on a movable insulator body slidable in the first housing section and resiliently urged away from said other contact member.

9. An electric shock device as set forth in claim 6 wherein said DC battery is contained in said second housing section having a releasable closure at the rear end to facilitate the insertion of said DC battery into said second housing section, said closure having an external male head that forms the releasable coupling for connecting to a handle on which said electric shock device may be releasably mounted.

10. An electric shock device comprising:

front and rear coaxially aligned housing sections having end portions slidably telescoping together for relative axial movement between an extended position and a contracted position, said housing sections having a front and rear metal tubular body respectively, said housing sections having portions to limit the extent of relative axial movement therebetween;

a high voltage electrode and a ground electrode mounted on an electric insulator body affixed in the front end of said front tubular body, there being an electric connection between one of said electrodes and said front housing section;

a plurality of DC cells in said rear housing section providing a DC voltage, each said DC cell having an anode and a cathode with the anode of the rearmost DC cell being arranged to be resiliently urged into electrical contact with said rear tubular metal body to electrically ground said anode;

a DC voltage step-up converter circuit on a circuit board in said front housing section for increasing said DC voltage to an amplitude and form suitable for electric shocking purposes, said circuit having a transformer for increasing the voltage and an inductor used in producing oscillations in said DC voltage, an opening in said front tubular metal to form an eddy current barrier for currents produced in said transformer and said inductor;

a control switch including a first contact element and a second contact element with at least one of said contact elements movable relative to the other contact element by the relative axial movement of said first and second housing sections to electrically couple said DC voltage to said converter; and a spring to resiliently urge said housing sections to said extended position and said movable contact element to an open, non-contacting position and yieldable to permit said housing sections to be moved under axially applied pressure to the contracted position and said movable contact element to a closed, contacting position against said other contact element and to connect the cathode of the front DC cell with said movable contact element whereby a shocking voltage is applied across said electrodes.

11. A DC voltage step-up converter comprising:

oscillator means for converting a DC voltage from a DC battery to an oscillating voltage that goes positive and then negative in relation to a reference;

an astable multivibrator circuit coupled between said DC battery and said oscillator means for continuously switching said DC voltage to said oscillator means on and then off for selected time intervals to provide timed bursts of said oscillating voltage;

transformer means coupled to said oscillator means for increasing the amplitude of said timed bursts of oscillating voltage;

voltage step-up means including a plurality of charging capacitors that are successively charged by said amplified timed bursts of oscillating voltage and a plurality of rectifying elements associated with said charging capacitors to rectify the voltage being applied thereto for further increasing the amplitude of the voltage of said timed bursts of oscillating voltage; and a capacitor alternately charged and discharged by said amplified timed bursts of oscillating voltage received from said voltage step-up means.

12. A DC voltage step-up converter as set forth in claim 11 wherein said multivibrator operates at a frequency of about 2 KHz.

13. A DC voltage step-up converter as set forth in claim 11 wherein said multivibrator is provided by a complimentary metal oxide semiconductor C-MOS integrated circuit chip.

14. A DC voltage step-up converter as set forth in claim 11 wherein said multivibrator includes a first NOR gate and a second NOR gate, each of said NOR gates each having two inputs, an output, a drain electrode and a source electrode, the two inputs of each of said NOR gates being connected together, the output of the first NOR gate being coupled to the input of the second NOR gate, the output of the second NOR gate being coupled to said oscillator means, said source electrodes being supplied by the voltage from said DC battery, said drain electrodes being connected to ground, a capacitor and a resistor are connected in series with one another between the output of said second NOR gate and the output of the first NOR gate with said resistor providing a charge path to said DC battery.

15. A DC voltage step-up converter as set forth in claim 10 wherein said oscillator means is switched on and off by said multivibrator at approximately equal time intervals.

16. A DC voltage step-up converter as set forth in claim 11 wherein said capacitor charging voltage step-up means is in the form of a voltage multiplier which includes:
- a first charging capacitor coupled between an input terminal of said voltage multiplier and ground;
- a plurality of successive charging capacitors connected in a series circuit between said input terminal and an output terminal, the capacitance value of each said first charging capacitor and successive charging capacitors being less as proceeding from the input terminal to the output terminal; and
- rectifier means operatively associated with said capacitors to rectify the bursts of oscillating voltage received from said transformer means whereby, the net effect is a charge on said capacitors that is cumulative between the input terminal and output terminal and the resulting voltage is substantially greater in amplitude.

17. A DC voltage step-up converter as set forth in claim 16 wherein said rectifier means includes a first rectifying element in series with said first charging capacitor between the output of a secondary winding of said transfer means and ground, a pair of rectifying elements connected in series with one another and connected across one of each of said series of successively charging capacitors, said first rectifying element and said pairs of rectifying elements being in series with one another between the output of said secondary winding and said output terminal, a neutralizing and charging capacitor connected across the first and next adjacent of said rectifying elements and one neutralizing and charging capacitor connected across each succeeding pair of rectifying elements toward said output terminal, each neutralizing and charging capacitor having the same capacitance as a charging capacitor in said series of successively charging capacitors.

18. A DC voltage step-up converter as set forth in claim 11 wherein said oscillator means operates at a frequency of about 300 Kh$_z$.

19. A DC voltage step-up converter for a voltage utilization device comprising:
- a DC battery;
- an astable multivibrator coupled to said DC battery through a control switch for continuously switching said DC voltage on and off for selected time intervals when said control switch is in an actuated position;
- an electric oscillator including an inductor coupled to said DC battery through said multivibrator and said control switch for converting the DC voltage of said battery to timed bursts of oscillating voltage that go positive and negative in relation to a zero reference in a substantially Class A mode of operation, said timed bursts having time intervals established by said multivibrator;
- a transformer including a primary winding and a secondary winding for increasing the magnitude of said timed bursts of oscillating voltage;
- an impedance interface coupled to said inductor providing a high impedance in parallel with said inductor and coupled between said inductor and the primary winding of said transformer for isolating said inductor from said primary winding and driving said primary winding;
- a voltage multiplier including a series of charging capacitors that are successively charged by said amplified timed bursts of oscillating voltage and a series of rectifying elements coupled to said charging capacitors to rectify the voltage being applied thereto for further increasing the amplitude of the voltage of said timed bursts of oscillating voltage; and
- a load capacitor connected across a pair of output terminals alternately charged and discharged by said amplified timed bursts of oscillating voltage from said voltage step-up means to provide a shocking voltage across said load capacitor that is generally unsymmetrical and oscillatory in form.

20. An electric shock device comprising:
a housing including first and second coaxially aligned housing sections having end portions slidably telescoping together for relative axial movement between an extended position and a contracted position;
a pair of electrically conductive electrodes affixed to and projecting outwardly from said first housing section;
a DC battery in said housing providing a DC voltage;
a DC voltage step-up converter in said housing for increasing said DC voltage to an amplitude and form suitable for electric shocking purposes;
a control switch including a first contact element and a second contact element with at least one of said contact elements movable relative to the other contact element by the relative axial movement of said first and second housing sections to electrically couple said DC voltage to said converter; and
means to resiliently urge said housing sections to said extended positon and said movable contact element to an open, non-contacting position and yieldable to permit said housing sections to be moved under pressure to the contracted position and said movable contact element to a closed, contacting position against said other contact element whereby a shocking voltage is applied across said electrodes, said converter including an electric converter circuit on a circuit board mounted in said first housing section, said circuit board being supported at the ends by a forward end cap and a rear end cap, said end caps being of an electric insulator material and sized to slidably insert into and close off the ends of said first housing section.

21. An electric shock device as set forth in claim 20 wherein each of said electrodes and said forward end cap are shaped to form a slot into which an end portion of said circuit board slidably inserts and fits in a friction-fit relationship to make an electric connection between one of said electrodes and said electric converter circuit.

22. An electric shock device as set forth in claim 21 wherein said forward and rear end caps have seal means to seal off the circuit board from external moisture.

23. An electric shock device as set forth in claim 20 wherein said other contact element is supported by said rear end cap.

24. An electric shock device comprising:
a housing including first and second coaxially aligned housing sections having end portions slidably telescoping together for relative axial movement between an extended position and a contracted position;
a pair of electrically conductive electrodes affixed to and projecting outwardly from said first housing section;
a DC battery in said housing providing a DC voltage;
a DC voltage step-up converter in said housing for increasing said DC voltage to an amplitude and form suitable for electric shocking purposes;
a control switch including a first contact element and a second contact element with at least one of said contact elements movable relative to the other contact element by the relative axial movement of said first and second housing sections to electrically couple said DC voltage to said converter; and
means to resiliently urge said housing sections to said extended position and said movable contact element to an open, non-contacting position and yieldable to permit said housing sections to be moved under pressure to the contracted position and said movable contact element to a closed, contacting position against said other contact element whereby a shocking voltage is applied across said electrodes,
said housing sections each having electrically conductive support bodies and said converter including an electric converter circuit having a transformer in said housing with windings wound about a first axis and an inductor in said housing with windings wound about a second axis, said first and second axes being disposed at angles of about 90 degrees to one another, said housing having an opening located adjacent to said transformer spanning an arc area of 90 degrees of the circumference of said first housing section and covering about a 90-degree quadrant of the end of said transformer to form an eddy current barrier between said transformer and said inductor.

25. An electric shock device as set forth in claim 24 including an electric insulator covering said opening.

26. An electric shock device comprising:
a housing including first and second coaxially aligned housing sections having end portions slidably telescoping together for relative axial movement between an extended position and a contracted position;
a pair of electrically conductive electrodes affixed to and projecting outwardly from said first housing section;
a DC battery in said housing providing a DC voltage;
a DC voltage step-up converter in said housing for increasing said DC voltage to an amplitude and form suitable for electric shocking purposes;
a control switch including a first contact element and a second contact element with at least one of said contact elements movable relative to the other contact element by the relative axial movement of said first and second housing sections to electrically couple said DC voltage to said converter; and
means to resiliently urge said housing sections to said extended position and said movable contact element to an open, non-contacting position and yieldable to permit said housing sections to be moved under pressure to the contracted position and said movable contact element to a closed, contacting position against said other contact element whereby a shocking voltage is applied across said electrodes,
said DC battery being in the form of a plurality of DC cells arranged end to end with each having an anode and a cathode, the anode of a front DC cell being in contact with said one contact element in the closed contacting position, the cathode of a rear DC cell being in contact with an electrically conductive closure member releasably fastened in the rear end of said second housing section that facilitates the removal and replacement of said DC cells from said rear housing section.

27. A DC voltage step-up converter comprising:
oscillator means for converting a DC voltage from a DC battery to an oscillating voltage that goes positive and then negative in relation to a reference;
switching means for continuously switching said DC voltage to said oscillator means on and then off for selected time intervals to provide timed bursts of said oscillating voltage;
transformer means coupled to said oscillator means for increasing the amplitude of said timed bursts of oscillating voltage;
voltage step-up means including a plurality of charging capacitors that are successively charged by said amplified timed bursts of oscillating voltage and a plurality of rectifying elements associated with said charging capacitors to rectify the voltage being applied thereto for further increasing the amplitude of the voltage of said timed bursts of oscillating voltage; and
a capacitor alternately charged and discharged by said amplified timed bursts of oscillating voltage received from said voltage step-up means,
said oscillator means including an inductor and said transformer means being coupled to said oscillator means by an impedance interface coupled to said inductor providing a higher impedance in parallel with said inductor that drives said transformer means.

28. A DC voltage step-up converter as set forth in claim 27 wherein said impedance interface is an emitter follower Darlington configuration of two transistors.

29. A DC voltage step-up converter comprising:
oscillator means for converting a DC voltage from a DC battery to an oscillating voltage that goes positive and then negative in relation to a reference;
switching means for continuously switching said DC voltage to said oscillator means on and then off for selected time intervals to provide times bursts of said oscillating voltage;
transformer means coupled to said oscillator means for increasing the amplitude of said timed bursts of oscillating voltage;
voltage step-up means including a plurality of charging capacitors that are successively charged by said amplified timed bursts of oscillating voltage and a plurality of rectifying elements associated with said charging capacitors to rectify the voltage being applied thereto for further increasing the amplitude of the voltage of said timed bursts of oscillating voltage;

a capacitor alternately charged and discharged by said amplifieid timed bursts of oscillating voltage received from said voltage step-up means; and an electric control switch coupled between said switching means and said oscillator means to selectively apply the DC voltage to said oscillator means.

* * * * *